(12) United States Patent
Cazaux et al.

(10) Patent No.: US 9,917,124 B2
(45) Date of Patent: Mar. 13, 2018

(54) IMAGE SENSOR WITH VERTICAL ELECTRODES

(71) Applicants: Commissariat à l'Energie Atomique et aux Energies Alternatives, Paris (FR); STMicroelectronics (Crolles 2) SAS, Crolles (FR); STMicroelectronics (GRENOBLE 2) SAS, Grenoble (FR)

(72) Inventors: Yvon Cazaux, Grenoble (FR); François Roy, Seyssins (FR); Arnaud Laflaquiere, Grenoble (FR); Marie Guillon, Fontanil-Cornillon (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 45 days.

(21) Appl. No.: 14/919,836

(22) Filed: Oct. 22, 2015

(65) Prior Publication Data

US 2016/0118432 A1 Apr. 28, 2016

(30) Foreign Application Priority Data

Oct. 27, 2014 (FR) ...................................... 14 60301

(51) Int. Cl.
*H01L 27/146* (2006.01)
*H01L 27/148* (2006.01)
*H01L 27/12* (2006.01)

(52) U.S. Cl.
CPC .... *H01L 27/14636* (2013.01); *H01L 27/1203* (2013.01); *H01L 27/1463* (2013.01); *H01L 27/14605* (2013.01); *H01L 27/14614* (2013.01)

(58) Field of Classification Search
USPC ................... 257/43, 233, 229, 225, 232.294; 348/294, 273, 280
See application file for complete search history.

(56) References Cited

U.S. PATENT DOCUMENTS

| | | |
|---|---|---|
| 2006/0081887 A1 | 4/2006 | Lyu |
| 2009/0266973 A1 | 10/2009 | Roy et al. |
| 2010/0059846 A1* | 3/2010 | Kim ................. H01L 27/14689 257/448 |

(Continued)

FOREIGN PATENT DOCUMENTS

EP 2315251 A1 4/2011

OTHER PUBLICATIONS

Preliminary Search Report filed in FR 14/60301 dated Jul. 21, 2015; 2 pages.

*Primary Examiner* — Moin Rahman
(74) *Attorney, Agent, or Firm* — Moreno IP Law LLC

(57) ABSTRACT

An image sensor arranged inside and on top of a semiconductor substrate having a front surface and a rear surface, the sensor including a plurality of pixels, each including: a photosensitive area, a reading area, and a storage area extending between the photosensitive area and the reading area; a vertical insulated electrode including an opening of transfer between the photosensitive area and the storage area; and at least one insulation element among the following: a) a layer of an insulating material extending under the surface of the photosensitive area and of the storage area and having its front surface in contact with the rear surface of the electrode; and b) an insulating wall extending vertically in the opening, or under the opening.

10 Claims, 4 Drawing Sheets

(56) References Cited

U.S. PATENT DOCUMENTS

| | | |
|---|---|---|
| 2010/0148289 A1 | 6/2010 | McCarten et al. |
| 2012/0161213 A1 | 6/2012 | Roy et al. |
| 2012/0261670 A1 | 10/2012 | Marty et al. |
| 2012/0261784 A1 | 10/2012 | Roy et al. |
| 2014/0209876 A1* | 7/2014 | Yamaguchi ........... H01L 27/307 257/40 |
| 2015/0048474 A1* | 2/2015 | Ishiwata ........... H01L 27/14603 257/443 |

* cited by examiner

IMAGE SENSOR WITH VERTICAL ELECTRODES

This application claims the priority benefit of French Patent application number 14/60301, filed on Oct. 27, 2014, the contents of which is hereby incorporated by reference in its entirety to the maximum extent allowable by law.

BACKGROUND

The present disclosure relates to an image sensor comprising a plurality of pixels formed inside and on top of a semiconductor substrate. A sensor adapted to a so-called global shutter control mode, that is, where all the sensor pixels are simultaneously exposed, is here more specifically considered. More particularly, a sensor having vertical control electrodes is here considered.

DISCUSSION OF THE RELATED ART

Pixel structures with vertical electrodes, compatible with a global shutter control, have already been provided by the applicants, particularly in patent applications US2014183685 and EP2752878, incorporated herein by reference. Structures of this type however need to be improved, particularly to decrease their sensitivity to certain spurious node sources.

SUMMARY

Thus, an embodiment provides an image sensor arranged inside and on top of a semiconductor substrate having a front surface and a rear surface, the sensor comprising a plurality of pixels, each comprising: a photosensitive area, a reading area, and a storage area extending between the photosensitive area and the reading area; a first vertical insulated electrode extending from the front surface of the substrate between the photosensitive area and the storage area, comprising at least one opening extending from the front surface of the substrate and defining an area of charge transfer between the photosensitive area and the storage area; and at least one insulation element among the following: a) a layer of an insulating material extending at least under the entire surface of the photosensitive area and under the entire surface of the storage area and having its front surface in contact with the rear surface of said electrode; and b) an insulating wall extending vertically inside of or opposite a lower portion of said opening, or under said opening, so that the depth of the charge transfer area is smaller than the depth of said electrode.

According to an embodiment, each pixel comprises at least insulation element a).

According to an embodiment, the substrate is an SOI-type substrate comprising a semiconductor support coated with an insulating layer coated with a semiconductor layer and, in each pixel, insulation element a) is the insulating layer of the substrate.

According to an embodiment, in each pixel, the photosensitive area, the storage area, the reading area, and the first electrode are arranged in the semiconductor layer of the substrate.

According to an embodiment, each pixel comprises at least insulation element b).

According to an embodiment, in each pixel, the vertical insulating wall comprises a doped region of the same conductivity type as the substrate and having a higher doping level than the substrate, located in a lower portion of the opening formed in the first electrode.

According to an embodiment, in each pixel, the opening formed in the first electrode extends down to a depth smaller than the total depth of the first electrode, and the insulating wall is formed by the portion of the first electrode located under said opening.

According to an embodiment, in each pixel, the insulating wall is formed by a vertical insulating trench extending from the rear surface of the substrate, opposite a lower portion of the opening formed in the first electrode.

According to an embodiment, in each pixel: the photosensitive area comprises a first well of a conductivity type opposite to that of the substrate, and the storage area comprises a second well of the conductivity type opposite to that of the substrate and having a depth greater than that of the first well; the first electrode extends down to a depth greater than or equal to that of the second well; and the vertical insulating wall extends between the rear surface plane of the first electrode, and a plane located under the rear surface plane of the first well.

According to an embodiment, each pixel comprises insulation element a) and insulation element b).

According to an embodiment, each pixel further comprises a second vertical insulated electrode extending from the front surface of the substrate between the storage area and the reading area, comprising at least one opening extending from the front surface of the substrate and defining a charge transfer area between the storage area and the reading area.

According to an embodiment, in each pixel, the photosensitive area is partially delimited by at least one third vertical insulated electrode extending from the front surface of the substrate.

According to an embodiment, in each pixel, the reading area is coupled to a read circuit of the pixel.

The foregoing and other features and advantages will be discussed in detail in the following non-limiting description of specific embodiments in connection with the accompanying drawings.

DETAILED DESCRIPTION

Figure 1A:
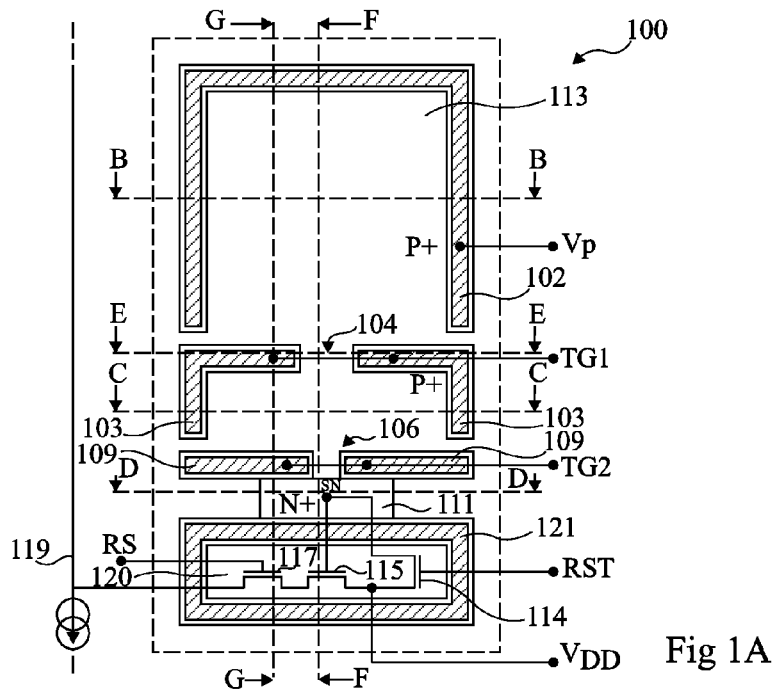
FIGS. 1A to 1G are cross-section and top views schematically showing the structure of an example of an image sensor pixel.
Figure 1B:
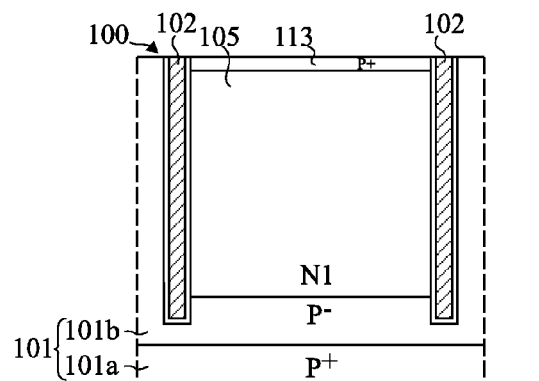
Figure 1C:
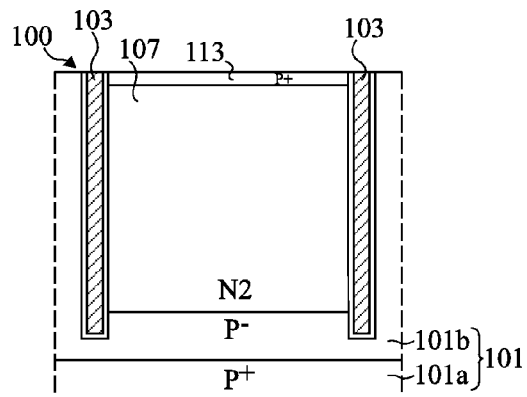
Figures 1D, 1E:
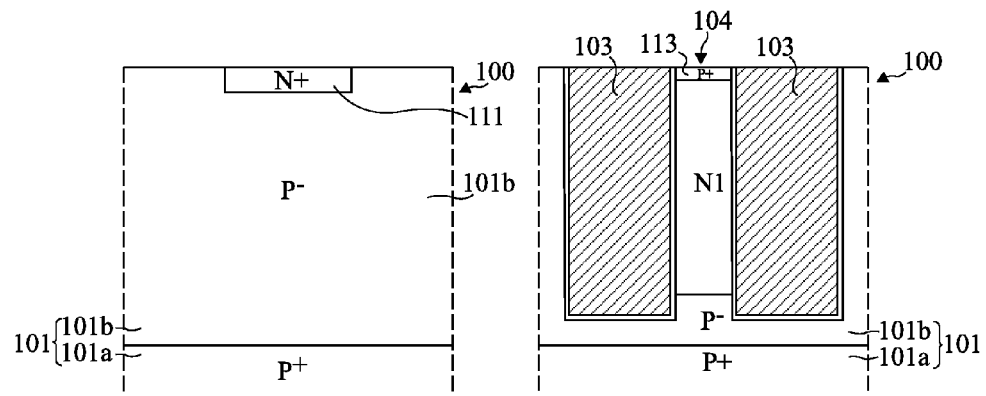
Figure 1F:
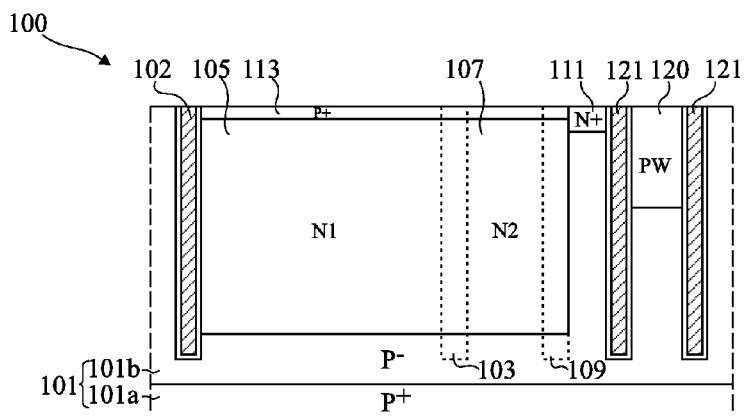
Figure 1G:
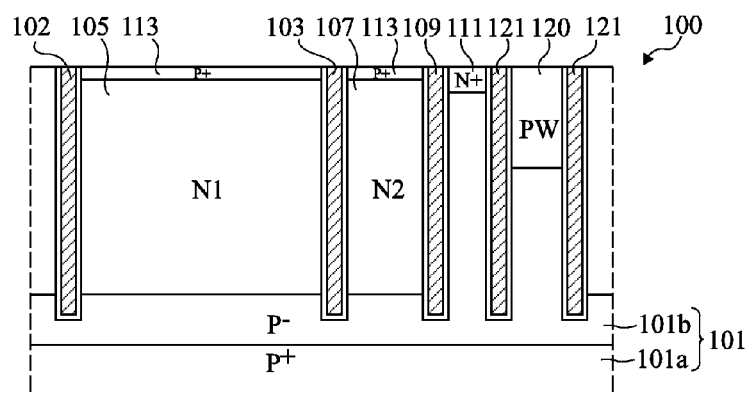

For clarity, the same elements have been designated with the same reference numerals in the various drawings and, further, as usual in the representation of integrated circuits, the various drawings are not to scale. Further, in the present disclosure, unless otherwise indicated, terms "approximately", "substantially", "around", "in the order of", etc. mean "to within 20%", and terms referring to directions, such as "upper", "lower", "topping", "above", "lateral", "horizontal", "vertical", etc. apply to devices arranged as illustrated in the corresponding views, it being understood that, in practice, the devices may have different directions.

FIGS. 1A to 1G schematically show an example of a pixel 100 of an image sensor formed inside and on top of a semiconductor substrate 101, for example, made of silicon. FIG. 1A shows pixel 100 in top view, and FIGS. 1B to 1G are side cross-section views respectively along planes B-B, C-C, D-D, E-E, F-F, and G-G of FIG. 1A. In practice, an image sensor may comprise a plurality of identical pixels 100 arranged inside and on top of a same semiconductor substrate, for example, in rows and columns.

Pixel 100 comprises a photosensitive area, an intermediate charge storage or memory area, and a reading area. The storage area extends between the photosensitive area and the reading area, that is, it has an edge common with the photo-sensitive area, and another edge common with the reading area. Pixel 100 further comprises a device enabling to transfer charges from the photosensitive area to the storage area, and from the storage area to the reading area, the reading area being connected to a read circuit of the pixel.

In this example, substrate 101 comprises a heavily-doped P-type silicon support 101a (P+), and a lightly-doped P-type layer 101b (P−), for example, an epitaxial layer, coating the upper surface of support 101a. The photosensitive area of pixel 100 comprises an N-type doped well 105, of doping level N1, formed in an upper portion of layer 101b. The storage area of the pixel comprises, juxtaposed to well 105, an N-type doped well 107, of doping level N2, formed in an upper portion of layer 101b. In this example, wells 105 and 107 have substantially the same depth. The described embodiments are however not limited to this specific case. Wells 105 and 107 are for example approximately parallel-epipedal with a common side. The dimensions and doping levels of wells 105 and 107 are preferably selected so that the photosensitive area and the pixel storage area have substantially equal charge storage capacities. In this example, well 105 has, in top view, a surface area greater than that of well 107, and its doping level (N1) is smaller than that (N2) of well 107, so that the photosensitive area and the storage area of the pixel have substantially equal charge storage capacities. A thin heavily-doped P-type layer 113 (P+) may be formed at the surface of wells 105 and 107. The reading area of pixel 100 comprises, juxtaposed to well 107, on the side of well 107 opposite to well 105 in this example, a heavily-doped N-type region 111 (N+). Region 111 is more heavily doped than wells 105 and 107, and extends in an upper portion of layer 101a, down to a depth smaller than that of well 107.

As a non-limiting example, layer 101b may have a thickness in the range from 1 to 30 µm, wells 105 and 107 may each have a thickness in the range from 1 to 10 µm, and preferably from 2 to 4 µm, reading region 111 may have a thickness in the range from 0.1 and 0.5 µm, and the doping levels may be in the range from $1*10^{14}$ to $1*10^{16}$ atoms/cm$^3$ for layer 101b, from $1*10^{18}$ to $1*10^{20}$ atoms/cm$^3$ for support 101a, from $1*10^{16}$ to $1*10^{18}$ atoms/cm$^3$ for wells 105 and 107, and from $1*10^{19}$ to $1*10^{22}$ atoms/cm$^3$ for region 111. As a variant, the support 101a may have a doping level below $1*10^{18}$ atoms/cm$^3$. As an example, the support 101a may have a light P-type doping level, for example a P-type doping level below $1*10^{15}$ atoms/cm$^3$. As an example, the support 101a may be non-intentionally doped.

An insulated vertical gate or electrode 103 extends from the upper surface or front surface of the substrate, between wells 105 and 107, at the level of their common side. Electrode 103 extends down to a depth at least equal to that of the deepest of wells 105 and 107. Electrode 103 insulates well 105 from well 107, except in a charge transfer area 104, defined by an opening formed in electrode 103 and connecting well 105 to well 107. In the shown example, electrode 103 extends down to a depth slightly greater than that of wells 105 and 107, and has, in top view, the shape of a U delimiting most of three sides of well 107, the horizontal bar of the U being located opposite thereto on the side common to wells 105 and 107. The opening defining transfer area 104 is located in the section of electrode 103 located between wells 105 and 107 (corresponding to the horizontal bar of the U in top view) and has the shape of a vertical strip extending along the entire height of electrode 103.

Another insulated vertical gate or electrode 109 extends from the front surface of the substrate between well 107 and reading region 111, at the level of their common side. Electrode 109 extends down to a depth substantially identical to that of electrode 103. Electrode 109 insulates well 107 from region 111, except in a charge transfer area 106, defined by an opening formed in electrode 109 and connecting well 107 to region 111. In the shown example, electrode 109 has the shape of a vertical section delimiting most of the side of well 107 juxtaposed to region 111 (that is, the side of well 107 opposite to transfer area 104), extending down to a depth slightly greater than that of well 107, and comprises an opening in the shape of a vertical band, which extends along its entire height and delimits transfer area 106.

In the shown example, another electrode or insulated vertical gate 102 extends from the front surface of the substrate, laterally delimiting most of the three sides of well 105 which are not delimited by electrode 103. Electrode 102 has for example substantially the same depth as electrodes 103 and 109.

To form electrodes 102, 103, and 109, one may for example form, around wells 105 and 107, trenches vertically extending in the substrate from the front surface thereof, according to a pattern corresponding to the desired shape of the electrodes. The lateral walls and the bottom of the trenches may be coated with an insulating material, for example, silicon oxide, after which the trenches may be filled with a conductive material. As an example, the conductive material for filling the trenches is heavily-doped polysilicon, for example with a doping level in the range from $1\times10^{18}$ atoms/cm$^3$ to $1\times10^{20}$ atoms/cm$^3$, or a metal, for example, copper or tungsten. As a non-limiting example, the trenches may have a depth in the range from 1 to 10 µm, and preferably from 2 to 5 µm, and a width in the range from 0.1 to 0.5 µm.

It should be noted that the shapes, in top view, of electrodes 102, 103, and 109, illustrated in FIG. 1A, are an indication only and may differ to improve the charge transfer. The shape of electrode 102 may in particular vary if the detection area is a photodiode which is pinned or controlled by the MOS (Metal Oxide Semiconductor) capacitances defined by the insulated conductive trenches.

The upper surfaces or front surfaces of electrodes 102, 103, and 109 and of region 111 are connected by metallizations (not shown) respectively to a node Vp of application of a bias signal, to nodes TG1 and TG2 of application of charge transfer control signals, and to a node SN connected or coupled to a voltage read circuit.

In the shown example, the read circuit (FIG. 1A) comprises a transistor 114 connecting node SN to a high power supply rail $V_{DD}$ of the sensor, a transistor 115 assembled as a follower source, having its gate connected to node SN and having its drain connected to rail $V_{DD}$, and a transistor 117 connecting the source of transistor 115 to a read line 119 of an array network comprising pixel 100. The gate of transistor 114 is connected to a node RST of application of a signal for controlling the resetting of region 111, and the gate of transistor 117 is connected to a node RS of application of a signal for selecting pixel 100. In this example, transistors 114, 115, and 117 are formed in a P-type well 120 (PW), laterally delimited by an insulating region 121. In this example, insulating region 121 comprises a trench with insulated walls filled with a conductive material surrounding well 120, where this trench may be formed at the same time as vertical electrodes 102, 103, and 109. Insulating region 121 may however be replaced with any other known device for peripherally insulating a well comprising transistors, for example, an STI-type trench or a junction isolation.

An example of a mode for using or controlling pixel 100 will now be described.

In a charge accumulation or integration phase, signals Vp and TG1 are set to a reference voltage. As an example this voltage may be the ground voltage, or may be negative with respect to ground, for example, in the order of −1 V. Such a biasing of electrodes 102 and 103 causes an accumulation of holes along the walls of the vertical trenches delimiting the photosensitive area. Holes also accumulate in transfer area 104, thus blocking electron exchanges between wells 105 and 107. Since substrate 101 is also biased to a reference voltage, for example, the ground voltage, a potential well forms in the photosensitive area, which, in the absence of illumination, depends on the doping levels and on the bias voltages of the electrodes and of the substrate. The doping levels and the bias voltages are preferably selected so that, in the absence of illumination and after resetting, well 105 of the photosensitive area is fully depleted (free of majority carriers, that is, of electrons in this example). When the pixel is illuminated, electron/hole pairs are photogenerated in the photosensitive area, and the photogenerated electrons are collected by well 105.

In a phase of transfer of the photogenerated charges accumulated the photosensitive area to the intermediate storage area, signal Vp remains unchanged, that is, electrode 102 remains biased to the same reference voltage as during the accumulation phase. This same reference voltage is also applied to signal TG2, which causes the accumulation of holes in transfer area 106, thus blocking electron exchanges between well 107 and region 111. Signal TG1 is set to a value greater than the maximum potential of the potential well formed in the photosensitive area during the integration, for example, at a value in the range from 2 to 3 V. This causes the transfer of the photogenerated electrons contained in well 105 into well 107, via transfer area 104. Once the transfer has been performed, signal TG1 is set back to the same low value as signals Vp and TG2, to create, in the storage area, a potential well capable of maintaining the transferred electrons confined in well 107, until a subsequent transfer to reading area 111. At this stage, the photosensitive is devoid of any photogenerated charge, that is, in a reset state, and a new integration phase may start.

In a phase of transfer of the charges contained in the storage area to reading area 111, signals Vp and TG1 are maintained at the same low value reference voltage as during the integration phase. Signal TG2 is set to a value greater than the maximum potential of the potential well formed in the storage area during the intermediate storage phase, for example, at a value in the range from 2 to 3 V. This causes the transfer of the photogenerated electrons contained in well 107 into region 111, via transfer area 106. Once the transfer has been performed, signal TG2 is set back to the same low value as signals Vp and TG1, to block electron exchanges between well 107 and region 111. At this stage, the storage area is devoid of any photogenerated charge, that is, in a reset state. The doping levels and the bias potentials are preferably selected so that, in the reset state, well 107 of the storage area is fully depleted (free of majority carriers, that is, of electrons in this example).

As detailed in above-mentioned patent applications US2014183685 and EP2752878, structures of the type described in relation with FIGS. 1A to 1G are particularly adapted to a global shutter control mode, particularly due to the presence, in each pixel, of a storage area or memory cell, which enables to store in relatively noise-immune fashion the photogenerated charges accumulated in the photodiode during the integration, before reading these charges via the reading area and the read circuit. As an example, during an integration period common to all the sensor pixels, photogenerated charges are accumulated in the photosensitive areas of the sensor pixels. At the end of the integration, a transfer phase is implemented simultaneously in all the sensor pixels, where, in each pixel, the photogenerated charged accumulated in the photosensitive area are transferred into the storage area. After the transfer phase, a complete image is stored in the different sensor storage areas. The stored image can then be read, line by line, via the reading area and the read circuit, during the next sensor integration period.

Although this has not been shown in FIGS. 1A to 1G, pixel 100 further comprises an opaque screen, for example, metallic, located on its upper surface or front surface side, masking the entire surface of the pixel storage area. As an example, the opaque screen masks the entire surface of the pixel except for the photosensitive area thereof. Such a screen particularly enables to avoid for charges to be photogenerated and accumulated in the storage area during the period of storage of an illumination level by the storage area, which would alter the stored information.

In practice, it can however be observed that known structures of pixels with vertical electrodes do not enable to totally do away with noise due to an accumulation of parasitic charges in the storage area, particularly during the period of storage of a signal by the storage area. This is particularly a problem in the case of a global shutter control of the above-described type. Indeed, in this case, the duration of storage of the signal by the storage area may be particularly long for certain sensor pixels (typically of the same order of magnitude as the integration period for the last pixels in the sensor pixel reading order). Further, the duration of signal storage by the storage area is not the same for all the sensor pixels. The diffusion of parasitic charges from the storage area may thus cause particularly disturbing artifacts in the final image.

It would be desirable to have a vertical electrode pixel structure compatible with a global shutter control, where the intermediate pixel storage area is better isolated from parasitic charge diffusions than in known structures.

The inventors have identified, in particular, that a source of parasitic charges in structures of the type described in relation with FIGS. 1A to 1G originates from light rays of high wavelengths, which are capable of being absorbed at a depth greater than that of electrode 103 of the pixel, for example, in silicon support 101a. The charges photogenerated at a depth greater than that of electrode 103 may be recombined in support 101a, or collected by well 105 of the photosensitive area. However, the inventors have observed that part of these charges laterally diffuses under electrode 103 and is collected by well 107 of the storage area, thus altering the information stored in the storage area.

Figure 2:
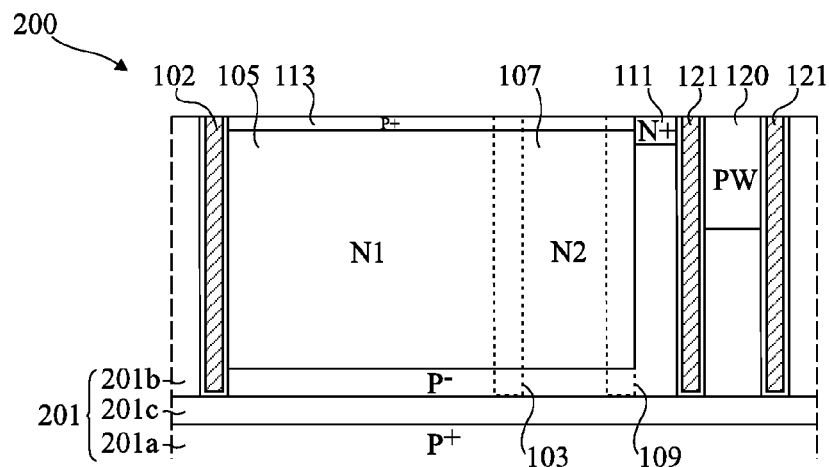
FIG. 2 is a cross-section view schematically showing the structure of an example of an image sensor pixel according to a first embodiment.

FIG. 2 schematically shows the structure of an example of an image sensor pixel 200 according to a first embodiment. Pixel 200 comprises elements common with pixel 100 of FIGS. 1A to 1G. These elements will thus not be described again. In the following, only the differences between pixels 100 and 200 will be detailed. FIG. 2 is a cross-section view of pixel 200 along a cross-section plane identical to that of FIG. 1F.

According to an aspect of the embodiment of FIG. 2, pixel 200 comprises an insulating layer extending horizontally under the entire surface of the photosensitive area and of the pixel storage area, for example, under the entire surface of the pixel, the upper surface or front surface of this layer being in contact with the lower surface or rear surface of electrode 103 for controlling the charge transfer between the photosensitive area and the pixel storage area.

Pixel 200 of FIG. 2 is formed inside and on top of a substrate 201 of semiconductor on insulator type (SOI). In this example, substrate 201 comprises a heavily-doped P-type silicon support 201a (P+), for example, identical or similar to support 101a of pixel 100 of FIGS. 1A to 1G, a lightly-doped P-type layer 201b (P−), for example, identical or similar to layer 101b of pixel 100 of FIGS. 1A to 1G, and an insulating layer 201c, for example, made of silicon oxide, arranged between support 201a and layer 201b. Pixel 200 comprises, formed inside and on top of layer 201b, substantially the same elements as the elements of pixel 100 formed inside and on top of layer 101b of pixel 100.

The upper surface or front surface of insulating layer 201c is in contact with the lower surface or rear surface of insulated vertical electrode 103 separating well 105 from well 107. In other words, insulated electrode 103 extends vertically across the entire thickness of layer 201b. In the shown example, insulated electrodes 102 and 109 and insulation region 121 have the same depth as electrode 103, and thus have their lower surface or rear surfaces in contact with the front surface of insulating layer 201c. Wells 105 and 107 may extend across the entire thickness of layer 201b, or across a thickness smaller than that of layer 201b, as shown in FIG. 2.

An advantage of pixel 200 of FIG. 2 over pixel 100 of FIGS. 1A to 1G is that it prevents charges photogenerated at a depth greater than that of electrode 103 from being collected by well 107 of the storage area. Indeed, when a ray of high wavelength reaches the photosensitive area of pixel 200, the corresponding photons may cross well 105 and then insulating layer 201c, and be absorbed in silicon support 201a, thus causing the generation of electron-hole pairs. However, the corresponding photogenerated electrons cannot cross dielectric layer 201c. They thus can be collected neither by well 105 of the photosensitive area, nor by well 107 of the storage area, and end up recombining with holes of support 201a.

Figure 3A:
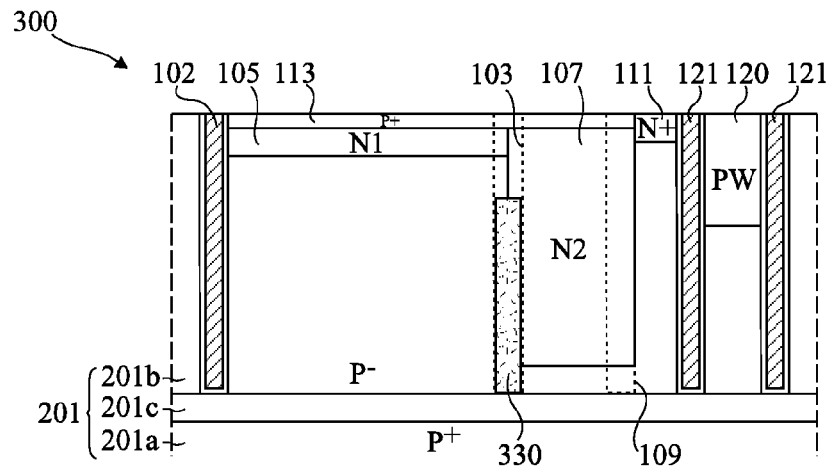
FIGS. 3A and 3B are cross-section views schematically showing the structure of an example of an image sensor pixel according to a second embodiment.
Figure 3B:
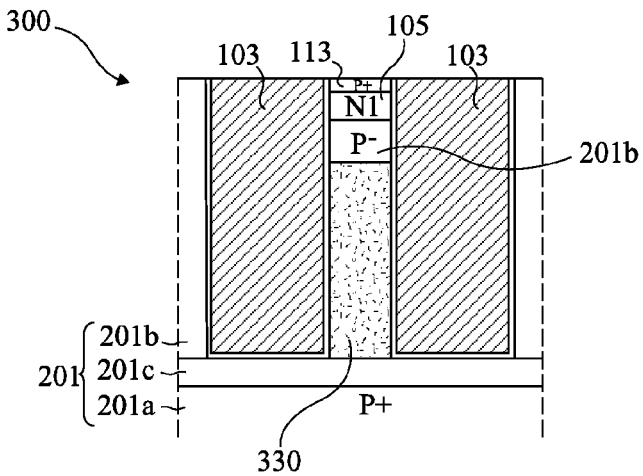

FIGS. 3A and 3B schematically shows the structure of an example of an image sensor pixel 300 according to a second embodiment. Pixel 300 comprises elements common with pixel 200 of FIG. 2. These elements will not be described again. In the following, only the differences between pixels 200 and 300 will be detailed. FIGS. 3A and 3B are cross-section views of pixel 300 along cross-section planes identical to those of FIGS. 1F and 1E, respectively.

Pixel 300 of FIGS. 3A and 3B differs from pixel 200 of FIG. 2 in that, in pixel 300, well 105 of the photosensitive area has a depth much lower than in pixel 200, for example, a depth in the range from 0.3 and 0.8 μm. In particular, in pixel 300, the depth of well 105 is, as an example, smaller than that of well 107 of the storage area, and smaller than that of transfer electrode 103. In pixel 300, the thickness of well 105 and the doping levels of well 105, of layer 113, and of layer 201b, are selected so that regions 105 and 201b form a pinned diode, or fully-depleted diode, that is, after resetting, in the absence of biasing of electrodes 102 and 103 and of the substrate, and in the absence of illumination, well 105 is totally deprived of majority carriers. In such conditions, a potential well forms in the photosensitive area, which only depends on the selected doping levels. The operation of pixel 300 may be identical or similar to what has been described in relation with FIGS. 1A to 1G.

In such a structure, the depth of the potential well formed at the level of the photosensitive area during the integration may be greater than the depth of well 105, but remains much smaller than the depth of electrode 103. Thus, when photons are absorbed at the level of the photosensitive area at an intermediate depth between the lower surface of well 105 and the lower surface of electrode 103, the resulting photogenerated charges are capable of diffusing towards the storage area, via the lower portion of the opening formed in electrode 103 (which is not blocking due to the fact that the lower portion of layer 201b is not depleted). These charges can then be collected by well 107 of the storage area, thus altering the information stored by the storage area.

To overcome this problem, according to an aspect of the embodiment of FIGS. 3A and 3B, pixel 300 comprises an insulating wall 330 extending vertically inside of or opposite a lower portion of the opening formed in electrode 103 and defining charge transfer area 104, or under this opening, so that the depth of charge transfer area 104 is smaller than the depth of electrode 103.

Preferably, the lower surface or rear surface of insulating wall 330 is located at a depth greater than that of the lower surface of electrode 103, and the upper surface or front surface of insulating wall 330 is located at a depth greater than that of the lower surface or rear surface of well 105. In the shown example, insulating wall 330 extends vertically in a lower portion of the opening formed in electrode 103, and delimiting transfer area 104, to insulate the photosensitive area from the storage area at the level of the lower portion of this opening.

In the example of FIGS. 3A and 3B, insulating wall 330 is formed by a heavily-doped P-type region, for example, having a doping level in the range from $1*10^{17}$ and $1*10^{19}$ atoms/cm$^3$. Region 330 is for example doped by deep implantation from the front surface of the substrate, for example, before the forming of wells 105 and 107 and of layer 113.

When photons are absorbed at the level of the photosensitive area at a depth greater than the maximum depth of the potential well of the photosensitive area, and lower than the depth of electrode 103, insulating wall 330 enables to avoid for the corresponding photogenerated charges to reach the storage area. These charges are then recombined in layer 201b or wall 330, or collected by the accumulation region of the photosensitive area.

As shown in FIGS. 3A and 3B, the embodiment described in relation with FIGS. 3A and 3B, that is, the provision of a vertical insulating wall limiting charge transfer area 104 to a smaller depth than electrode 103, may be combined with the embodiment of FIG. 2, that is, the provision of an insulating layer in contact with the lower surface of electrode 103 under the pixel surface. This has the advantage of considerably limiting risks of parasitic charge collection by the storage area during the time of storage of a signal level by the storage area, and this, whatever the sensor illumination wavelengths.

However, the embodiment of FIGS. 3A and 3B (vertical insulating wall) may also be used independently from the embodiment of FIG. 2 (insulating layer under the pixel surface). In particular, in pixel 300 of FIGS. 3A and 3B, if the pixel comprises no wavelengths capable of being absorbed at a depth greater than that of electrode 103, insulating layer 201c may be omitted.

Figure 4:
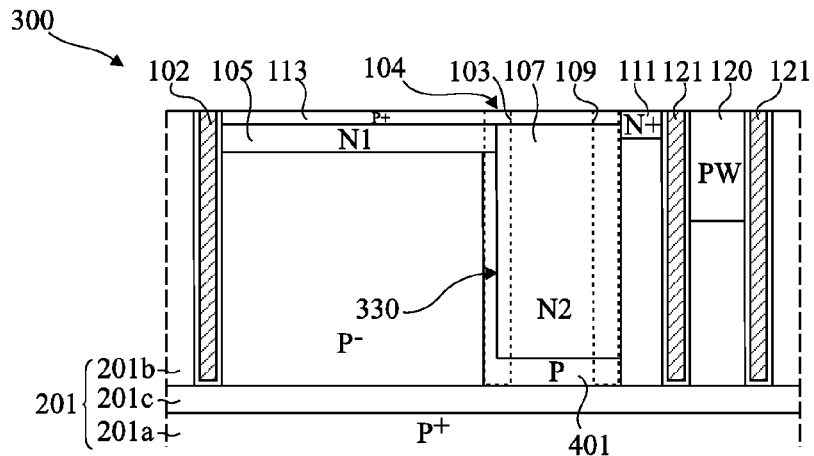
FIG. 4 is a cross-section view schematically and partially showing an alternative embodiment of the pixel of FIGS. 3A and 3B.

FIG. 4 schematically shows an alternative embodiment of pixel 300 of FIGS. 3A and 3B. FIG. 4 is a cross-section view of pixel 300 along a cross-section plane identical to that of FIG. 3A. Only the differences between pixel 300 of FIG. 4 and pixel 300 of FIGS. 3A and 3B will be detailed hereafter.

Pixel 300 of FIG. 4 differs from pixel 300 of FIGS. 3A and 3B essentially in the way to form its vertical insulating wall 330. In this example, before the forming of N-type wells 105 and 107, a P-type well 401, having a doping level greater than that of layer 201b, is formed in layer 201b from the front surface of the substrate, this well extending, in top view, over the entire surface of the storage area and of charge transfer area 104, and interrupting at the level of the photosensitive area of the pixel. The doping level of well 401 is for example in the range from $1*10^{16}$ to $1*10^{19}$ atoms/cm$^3$. The depth of well 401 is preferably greater than the depth of well 107.

After the forming of well 401, N-type wells 105 and 107 are formed. In top view (not shown), wells 105 and 107 have an adjacent edge located inside of well 401. More particularly, in the shown example, the portion of well 401 located under well 105 (in the vertical opening formed in electrode 103), forms vertical insulating wall 330 enabling to prevent the lateral diffusion of parasitic charges from the photosensitive area to the storage area, via the opening formed in electrode 103.

In the shown example, well 401 has a greater depth than well 107 of the storage area, which has the additional advantage of blocking the diffusion of parasitic charges to the storage area by the lower surface of the storage area. As a variation, well 401 may have the same depth as well 107.

Figure 5:
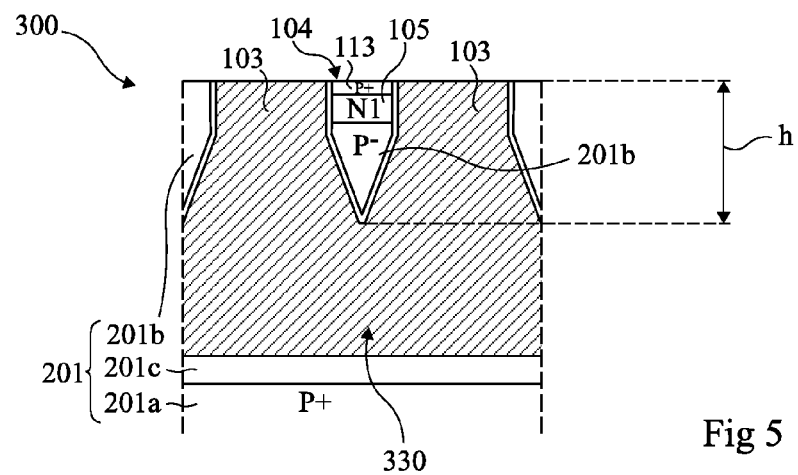
FIG. 5 is a cross-section view schematically and partially showing another alternative embodiment of the pixel of FIGS. 3A and 3B.

FIG. 5 schematically shows another alternative embodiment of pixel 300 of FIGS. 3A and 3B. FIG. 5 is a cross-section view of pixel 300 along a cross-section plane identical to that of FIG. 3B. Only the differences between pixel 300 of FIG. 5 and pixel 300 of FIGS. 3A and 3B will be detailed hereafter.

Pixel 300 of FIG. 5 differs from pixel 300 of FIGS. 3A and 3B essentially by the nature of its vertical insulating wall 330. In the example of FIG. 5, the opening formed in insulated vertical electrode 103, defining charge transfer region 104 of the pixel, has a smaller depth than electrode 103. Thus, vertical insulating wall 330 is formed by insulated electrode portion 103 located under the opening formed in electrode 103, that is, under charge transfer region 104.

To form an electrode 103 having a vertical opening extending down to a depth smaller than the total electrode depth, it may be provided to form trenches according to a pattern having, in top view, substantially the same shape as what has been previously described, but using an etch method capable of forming trenches having a lower portion wider than their upper portion, or flared trenches, sometimes called bottle-shaped trenches. The spacing between electrode portions 103 at the upper surface of the substrate is selected to be such that the trenches join at a determined depth h, smaller than the maximum depth of electrode 103, and preferably greater than the depth of well 105. Distance h corresponds to the height of the charge transfer area. The lateral walls and the bottom of the trenches may then be coated with an insulating material, after which the trenches may be filled with a conductive material.

Figure 6:
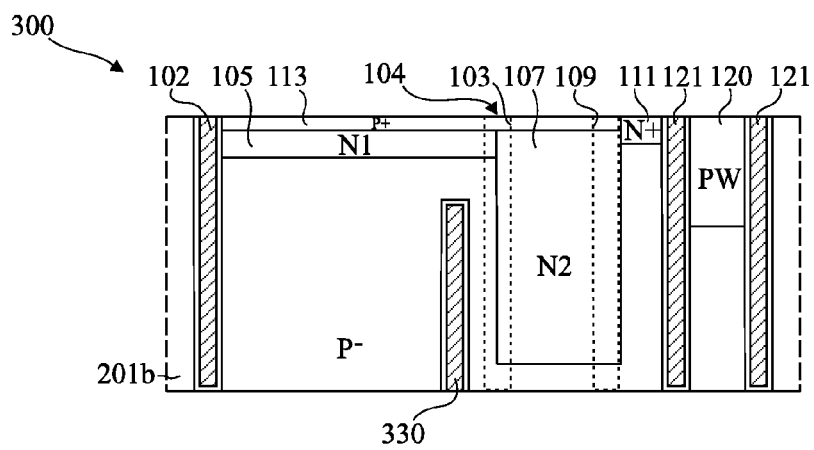
FIG. 6 is a cross-section view schematically and partially showing another alternative embodiment of the pixel of FIGS. 3A and 3B.

FIG. 6 schematically shows another alternative embodiment of pixel 300 of FIGS. 3A and 3B. FIG. 6 is a cross-section view of pixel 300 along a cross-section plane identical to that of FIG. 3A. Only the differences between pixel 300 of FIG. 6 and pixel 300 of FIGS. 3A and 3B will be detailed hereafter.

Pixel 300 of FIG. 6 differs from pixel 300 of the previous examples in that it is intended to be illuminated from its rear surface, while the examples of FIGS. 3A and 3B, 4 and 5 aim at front-side illuminated pixels. Pixel 300 of FIG. 6 further differs from pixel 300 of FIGS. 3A and 3B by the nature of its vertical insulating wall 330.

The forming of pixel 300 of FIG. 6 comprises substantially the same steps as the forming of pixel 300 of FIGS. 3A to 3B, except for the step of forming insulating wall 330, and further comprises, after the forming of the various pixel elements on the front surface side of the substrate (particularly, electrodes 102, 103, and 109, wells 105, 107, and 120, regions 111 and 121, and layer 113), a step of thinning substrate 201 from its rear surface. In the shown example, during the thinning, only layer 201b of substrate 201 is kept, that is, the thinning is stopped after the removal of support 201a and of insulating layer 201c. A protection coating may be arranged on the rear surface of the pixel after the thinning. As a variation, layer 201c may be totally or partly kept, to protect the rear surface of the pixel. Prior to the thinning, a handle of the support (not shown) may be adjoined to the sensor on its front surface side. As a variation, pixel 300 of FIG. 6 may be formed from a semiconductor substrate of the type described in relation with FIGS. 1A to 1G, comprising no intermediate insulating layer.

In the example of FIG. 6, wall 330 is formed by a vertical insulating trench formed after the thinning step, from the rear surface of the substrate, inside of or opposite a lower portion of the vertical opening formed in electrode 103 and defining charge transfer area 104. The insulated trench forming wall 330 preferably stops at a level lower than the lower surface of well 105. In the shown example, the insulating trench forming wall 330 is located opposite the lower portion of the opening formed in electrode 103, that is, laterally shifted with respect to electrode 103. This enables to simplify the forming of this trench, by decreasing alignment constraints relative to electrode 103. However, to obtain a significant effect of storage area insulation, the lateral distance between the trench forming wall 330 and electrode 103 will preferably be selected to be relatively low, for example, in the range from 50 to 400 nm. In the shown example, the trench forming wall 330 is located on the side of the photosensitive area. As a variation, the trench forming wall 330 is located on the side of the storage area.

In the shown example, the trench forming wall 330 is of the same type as the insulated vertical electrodes of the sensor, that is, the trench walls are coated with an insulating layer, the trench core being filled with a conductive material. As a variation, the trench may be totally filled with an insulating material, for example, silicon oxide.

Specific embodiments have been described. Various alterations, modifications, and improvements will readily occur to those skilled in the art.

In particular, the described embodiments may be adapted to other vertical electrode pixel structures comprising a photosensitive area and a storage area than those described hereabove. For example, it will be within the abilities of those skilled in the art to adapt the described embodiments to a pixel structure further comprising an anti-dazzle device adjoined to the photosensitive area, enabling to avoid that, in the occurrence of a saturation of the photosensitive area during an integration period, an excess of photogenerated charges flows into the intermediate storage area, causing a pollution of the image acquired during the previous integration period. More particularly, the described embodiments may be adapted to a pixel structure of the type described in relation with FIGS. 4 and 5 of above-mentioned patent applications US2014183685 and EP2752878.

Further, the described embodiment may be adapted to pixel structures where all the conductivity types are inverted with respect to the above-mentioned examples.

Further, the described embodiments are not limited to the example of read circuit shown in FIG. 1A. It will be within the abilities of those skilled in the art to obtain the desired operation by using other known read circuits.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor arranged inside and on top of a semiconductor substrate having a front surface and a rear surface, the sensor comprising a plurality of pixels, each comprising:
 a photosensitive area, a reading area, and a storage area extending between the photosensitive area and the reading area;
 a first vertical insulated electrode extending from the front surface of the substrate between the photosensitive area and the storage area, comprising at least one opening extending from the front surface of the substrate and defining an area of charge transfer between the photosensitive area and the storage area; and
 an insulation element comprising a layer of an insulating material extending at least under the entire surface of the photosensitive area and under the entire surface of the storage area and having its front surface in contact with the rear surface of said first vertical insulated electrode,
 wherein each pixel further comprises a second vertical insulated electrode extending from the front surface of the substrate between the storage area and the reading area, comprising at least one opening extending from the front surface of the substrate and defining a charge transfer area between the storage area and the reading area.

2. The sensor of claim 1, wherein the substrate is an SOI-type substrate comprising a semiconductor support coated with an insulating layer coated with a semiconductor layer, and wherein, in each pixel, the insulation element is the insulating layer of the substrate.

3. The sensor of claim 2, wherein, in each pixel, the photosensitive area, the storage area, the reading area, and the first vertical insulated electrode are arranged in the semiconductor layer of the substrate.

4. The sensor of claim 1, wherein each pixel comprises an insulating wall extending vertically inside of or opposite a lower portion of said opening, or under said opening, so that the depth of the charge transfer area is smaller than the depth of said first vertical insulated electrode.

5. The sensor of claim 4, wherein, in each pixel, the vertical insulating wall comprises a doped region of the same conductivity type as the substrate and having a higher doping level than the substrate, located in a lower portion of the opening formed in the first vertical insulated electrode.

6. The sensor of claim 4, wherein, in each pixel, the opening formed in the first vertical insulated electrode extends down to a depth smaller than the total depth of the first vertical insulated electrode, and wherein the insulating wall is formed by the portion of the first vertical insulated electrode located under said opening.

7. The sensor of claim 4, wherein, in each pixel, the insulating wall is formed by a vertical insulating trench extending from the rear surface of the substrate, opposite a lower portion of the opening formed in the first vertical insulated electrode.

8. The sensor of claim 4, wherein, in each pixel:
 the photosensitive area comprises a first well of a conductivity type opposite to that of the substrate, and the storage area comprises a second well of the conductivity type opposite to that of the substrate and having a depth greater than that of the first well;
 the first vertical insulated electrode extends down to a depth greater than or equal to that of the second well; and
 the vertical insulating wall extends between the rear surface plane of the first vertical insulated electrode, and a plane located under the rear surface plane of the first well.

9. The sensor of claim 1, wherein, in each pixel, the photosensitive area is partially delimited by at least one third vertical insulated electrode extending from the front surface of the substrate.

10. The sensor of claim 1, wherein, in each pixel, the rear area is coupled to a read circuit of the pixel.

* * * * *

UNITED STATES PATENT AND TRADEMARK OFFICE
CERTIFICATE OF CORRECTION

PATENT NO. : 9,917,124 B2
APPLICATION NO. : 14/919836
DATED : March 13, 2018
INVENTOR(S) : Yvon Cazaux et al.

Page 1 of 1

It is certified that error appears in the above-identified patent and that said Letters Patent is hereby corrected as shown below:

On the Title Page

Item (73) Assignee, should read as follows:

Commissariat à l'Energie Atomique et aux Energies Alternatives
Paris, France

And
STMicroelectronics (Crolles 2) SAS
Crolles, France

And
STMicroelectronics (GRENOBLE 2) SAS
Grenoble, France

Signed and Sealed this
Sixth Day of August, 2019

Andrei Iancu
*Director of the United States Patent and Trademark Office*